United States Patent
Lindley et al.

[11] 3,962,577
[45] June 8, 1976

[54] ELECTRO-OPTIC SYSTEM WITH EXPANDED POWER RANGE

[75] Inventors: John P. Lindley, Redwood City; James Rieden, San Jose, both of Calif.

[73] Assignee: Itek Corporation, Lexington, Mass.

[22] Filed: Jan. 10, 1975

[21] Appl. No.: 540,181

[52] U.S. Cl............................ 250/208; 250/216; 250/226; 250/578; 356/74; 356/93
[51] Int. Cl.² .................... G01J 3/02; G01J 3/42; G01J 3/34
[58] Field of Search .......... 250/200, 205, 208, 209, 250/216, 226, 238, 578; 356/74, 93

[56] References Cited
UNITED STATES PATENTS

| | | | |
|---|---|---|---|
| 2,744,439 | 5/1956 | Hill ................................ | 250/205 X |
| 3,011,386 | 12/1961 | Rosenthal ......................... | 356/83 |
| 3,653,765 | 4/1972 | Hearn ............................ | 356/93 X |
| 3,861,801 | 1/1975 | Peters et al. ..................... | 356/74 |

Primary Examiner—Alfred E. Smith
Assistant Examiner—E. R. La Roche
Attorney, Agent, or Firm—Homer O. Blair; Robert L. Nathans; Gerald H. Glanzman

[57] ABSTRACT

An electro-optic system having an extended dynamic power range. The dynamic power range of a Bragg cell spectrum analyzer is expanded by unevenly splitting the radiation output of the Bragg cell with a beam splitter and directing a major portion of the radiation output to a first photodiode array and a minor portion of the radiation output to a second photodiode array. The first photodiode array is utilized to detect the output of the Bragg cell until it becomes sufficiently intense to saturate it. When the first photodiode array becomes saturated, the second photodiode array, which receives a minor amount of radiation from the Bragg cell, is utilized to detect the output of the Bragg cell. Detection with the first and second photodiode arrays allows the dynamic power detection range of the system to be expanded to include the combined detection ranges of the first and second photodiode arrays.

5 Claims, 1 Drawing Figure

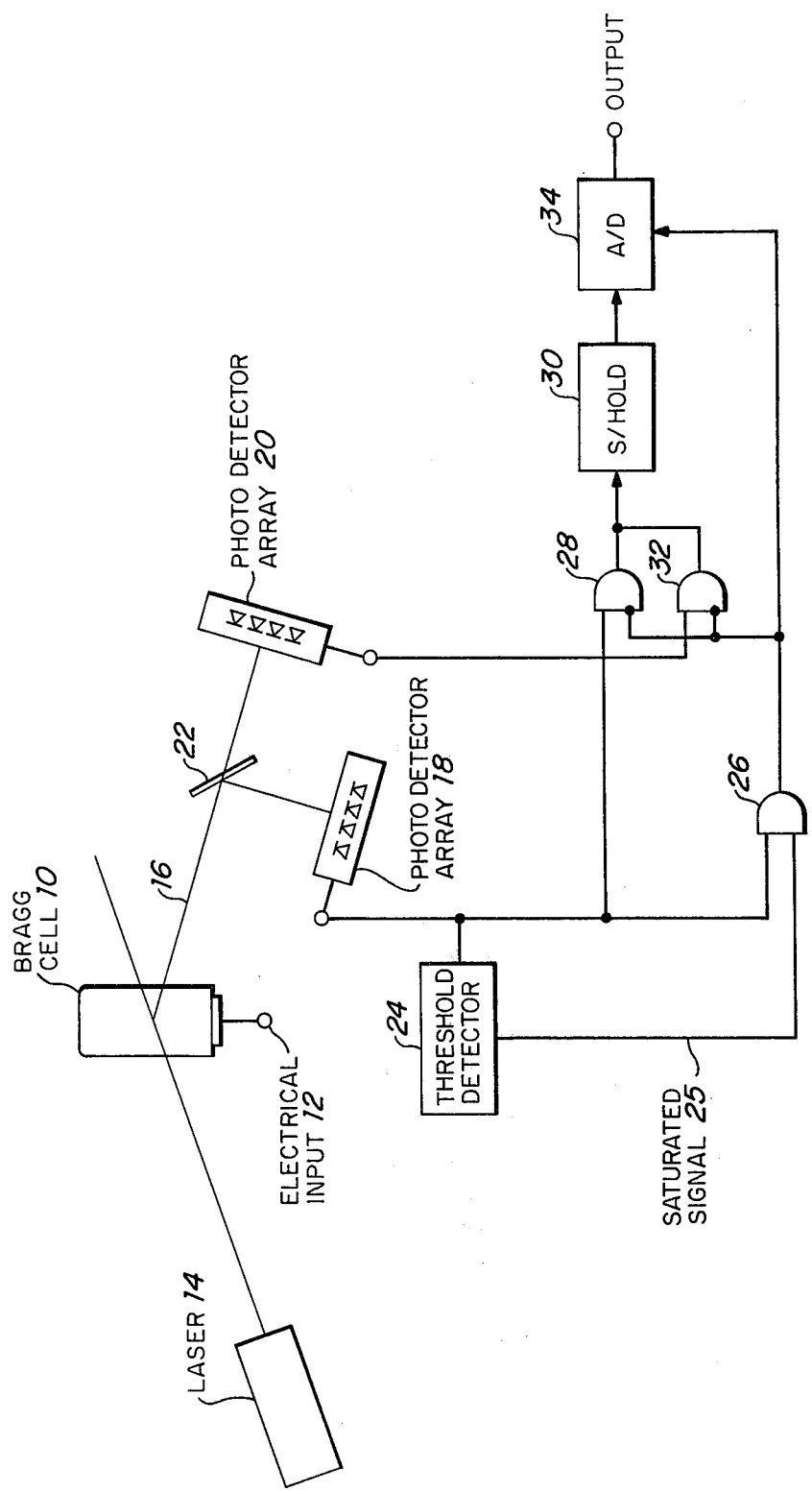

ELECTRO-OPTIC SYSTEM WITH EXPANDED POWER RANGE

BACKGROUND OF THE INVENTION

The dynamic power range of many electro-optic systems is limited by the characteristics of current photodetector arrays. For example, in the disclosed embodiment wherein the electro-optic system is a Bragg cell spectrum analyzer, the dynamic range of the Bragg cell is over 50 dB, but the dynamic range of the photodiode array is limited to a 20 to 25 dB range in light power, primarily because of residual noise in the switching circuits which access the photodiode array. The limitations on dynamic power range are further complicated by the square law characteristics of the detectors which result in the requirement of an output electronic dynamic range of 50 dB to handle a 25 dB range of input light power. Because of this requirement, an electro-optic system designed to fully utilize the 50 dB dynamic power range capability of a Bragg cell with a single photodetector array would require an output electronic dynamic power range of 100 dB, which, if at all possible, would be an extremely difficult task.

SUMMARY OF THE INVENTION

In accordance with a preferred embodiment of the invention an electro-optic system is disclosed for detecting radiation over an extended dynamic power range. The system includes first and second photodetector means for detecting radiation. A major amount of the radiation to be detected is directed onto the first photodetector means, and a minor amount of the radiation to be detected is directed onto the second photodetector means. The first photodetector means is utilized to detect radiation signals having relatively weak power densities, and the second photodetector means is utilized to detect radiation having relatively strong power densities, with the result that the dynamic power detection range of the system includes the combined power detection ranges of both the first and second photodetector means.

Further, in accordance with a preferred emodiment a beam splitter is utilized to direct a major amount of radiation to the first photodetector means and a minor amount of the radiation to the second photodetector means.

BRIEF DESCRIPTION OF THE DRAWING

The FIGURE illustrates a schematic representation of one embodiment of the present invention.

DESCRIPTION OF A PREFERRED EMBODIMENT

Referring to the FIGURE, there is illustrated a Bragg cell spectrum analyzer system. The spectrum analyzer includes a Bragg cell 10 having an electrical input 12 and a radiation input from a laser 14. As is known with this type of system, an electrical input system at 12 excites an acoustical transducer on the Bragg cell to cause acoustical waves to be formed across the cell. The acoustical waves cause the radiation beam traveling through the cell to be diffracted to form an output radiation beam 16 which is illustrated in the FIGURE as one beam but which actually consists of an angular array of beams. As is known regarding Bragg cells, the acoustical wave causes part of the laser beam traveling through the cell to deflect with the amplitude of the deflection being proportional to the amplitude of the acoustical signal and the angle of deflection being proportional to the frequency of the acoustical signal. If the acoustical signal has multiple components at different frequencies the output of the Bragg cell will consist of multiple spots of light with the position of each light spot being related to the frequency of each component and the intensity of each light spot being proportional to the strength of each component.

With the current state of the art of Bragg cells, the dynamic range of the Bragg cell is over 50 dB, but the photodiode dynamic range is limited to a 20 to 25 dB range in light power, primarily because of residual noise introduced by the switching circuit which accesses the photodiode array. The limitations on dynamic power range are further complicated by the square law characteristics of the diode detectors. Each diode produces an output voltage proportional to its input light power, and since the power out of each diode is $V^2/R$ the electrical power output of each diode is proportional to the square of its input light power. Because of that characteristic an output electronic dynamic range of 50 dB is required to handle a 25 dB light power input range. To build a system with the capability of utilizing the 50 dB dynamic range of the Bragg cell with a single photodiode array would require an output electronic dynamic range of 100 dB, which, if possible, would be an extremely difficult task. The output 16 of the Bragg cell 10 is normally detected by a photodetector array, which may consist of a linear array of photodiodes, such as a linear array of 500 diodes as is available from Reticon Corp. The linear array of photodiodes produces an output signal which indicates the angular components of the output beam 16 and also the amplitudes of each of the components.

The FIGURE illustrates a system for approximately doubling the dynamic range of a Bragg cell spectrum analyzer by adding a second photodiode array. In accordance with the teachings of this invention, the output beam 16 is divided by a beam splitter 22 into two unequal beams, one of which is directed to a first photodiode array 18 and the second of which is directed to a second photodiode array 20. Either array could receive either of the major or minor portions of the output beam. For the sake of explanation of this invention, the major portion is directed to photodiode array 18 and the minor portion is directed to photodiode array 20.

The system is designed to achieve a 40 dB dynamic power range from two photodiode arrays, each of which has a 20 dB dynamic power range. As is known in the art, a decibel (dB) is a power ratio equal to the 10th root of 10, or about 1.259. An increase of 10 dB requires a 10-fold increase in power and a 20 dB increase corresponds to a 100 fold increase of power. Accordingly, in the preferred embodiment the beam splitter 22 is designed to split the output beam 16 into a 99% beam and a 1% beam. In the preferred embodiment both photodiode arrays are simultaneously scanned serially, and a threshold circuit 24 is utilized to detect if each photodiode in array 18 (which receives the major portion (99%) of the beam and is utilized to detect low power levels) is saturated. If a scanned photodiode is not saturated a signal is not produced on line 25, and accordingly AND gate 26 does not produce an output. This enables NAND gate 28 to pass the output of the scanned photodiode in array 18 to a sample and hold circuit 30. If a scanned photodiode in array 18 is saturated, a saturated signal appears on line 25 to enable AND gate 26, which enables AND gate 32 and disables NAND gate 28. This allows the output of the corresponding photodiode in array 20 to pass to the sample and hold circuit 30. Thus sample and hold circuit 30 will contain outputs from both arrays 18 and 20. The output of sample and hold circuit may be directed to an A/D converter 34 to produce a digital output, as illustrated in the FIGURE, or may be utilized directly as an output signal. In digital signal form, the most significant bit for each diode would indicate whether the output is derived from photodiode array 18 or photodiode array 20. This information is available to A/D converter 34 directly from AND gate 26.

While several embodiments have been described, the teachings of this invention will suggest many other embodiments to those skilled in the art. Also, although the preferred embodiment has been illustrated as an electro-optic system which is a Bragg cell spectrum analyzer, the teachings of this invention may be utilized to expand the dynamic power range of other types of electro-optic systems.

We claim:

1. An electro-optic system for detecting radiation over an extended dynamic power range and comprising:
   a. a first photodetector means for detecting radiation;
   b. a second photodetector means for detecting radiation;
   c. means for directing radiation to be detected onto said first and second photodetector means, and including means for directing a major amount of radiation to be detected onto said first photodetector means, and means for directing a minor amount of radiation to be detected onto said second photodetector means such that said first photodetector means may be utilized to detect radiation signals having relatively weak power densities and said second photodetector means may be utilized to detect radiation signals having relatively strong power densities, whereby the dynamic power detection range of the system includes the combined power detection ranges of said first and second photodetector means; and
   d. means for determining when the major amount of radiation directed onto said first photodetector means exceeds a given threshold level, means for coupling said first photodetector means to the output of the system until said determining means indicates that the radiation directed onto said first photodetector means exceeds said given threshold level, and means for coupling said second photodetector means to the output of the system when said determining means indicates that the radiation directed onto said first photodetector means exceeds said given threshold level.

2. A system as set forth in claim 1 wherein said means for directing a major amount of radiation onto said first photodetector means includes means for directing greater than 90% of the radiation onto said first photodetector means, and said means for directing a minor amount of radiation onto said second photodetector means includes means for directing less than 10% of the radiation onto said second photodetector means.

3. A system as set forth in claim 1 wherein said first and second photodetector means include first and second photodiode arrays.

4. A system as set forth in claim 3 wherein said means for directing a major amount of radiation onto said first detector means includes means for directing approximately 99% of the radiation onto said first photodetector means, and said means for directing a minor amount of radiation onto said second photodetector means includes means for directing approximately 1% of the radiation onto said second photodetector means.

5. A system as set forth in claim 4 wherein said means for directing major and minor amounts of radiation includes a beam splitter.

* * * * *